US007049842B2

(12) United States Patent
Lopezdenava

(10) Patent No.: US 7,049,842 B2
(45) Date of Patent: May 23, 2006

(54) SIMULTANEOUS PIN SHORT AND CONTINUITY TEST ON IC PACKAGES

(75) Inventor: Victor Hugo Lopezdenava, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 10/739,678

(22) Filed: Dec. 18, 2003

(65) Prior Publication Data

US 2005/0134301 A1    Jun. 23, 2005

(51) Int. Cl.
  *G01R 31/28* (2006.01)
  *G01R 31/02* (2006.01)
(52) U.S. Cl. .................... 324/765; 324/158.1; 324/537
(58) Field of Classification Search .................... None
  See application file for complete search history.

(56) References Cited

U.S. PATENT DOCUMENTS 3,851,161 A * 11/1974 Sloop ............................ 716/4
4,241,307 A * 12/1980 Hong ........................... 324/555
4,395,767 A *  7/1983 Van Brunt et al. ........... 714/736
4,779,041 A * 10/1988 Williamson, Jr. ............ 324/537
6,590,382 B1 *  7/2003 Angelotti et al. ........ 324/158.1
6,710,607 B1 *  3/2004 Fujii et al. .................. 324/750

* cited by examiner

Primary Examiner—Ernest Karlsen
(74) Attorney, Agent, or Firm—W. Daniel Swayze, Jr.; W. James Brady; Frederick J. Telecky, Jr.

(57) ABSTRACT

An integrated circuit functionality test determining shorts between adjacent pins of all the IC pins while simultaneously determining pin continuity in only three steps. The process includes categorizing all pins of the IC into three sets of pins. One set of pins is connected to digital instruments, a second set of pins is connected to 0 volts, and a third set of pins is left open. The digital instruments sink current in parallel from the first set of pins to identify any shorts of the first set of pins. The process is repeated for each of the other two sets of pins. For IC packages having double and quad terminal positions, each terminal position is treated like a single terminal position, and the measurements of the respective sets of pins of each terminal position is measured in parallel.

10 Claims, 3 Drawing Sheets

Single terminal position:

US 7,049,842 B2

SIMULTANEOUS PIN SHORT AND CONTINUITY TEST ON IC PACKAGES

FIELD OF THE INVENTION

The present invention is generally related to the field of integrated circuits (ICs), and more particularly to the manufacturing process of identifying shorts between adjacent pins and ensuring continuity for IC packages having single, dual and quad terminal positions.

BACKGROUND OF THE INVENTION

During the product testing phase of semiconductor IC processing, packaged die are routinely put through operability testing by checking for shorts between adjacent pins, and also ensuring continuity of all pins. This quality control process is performed on all package styles, including those packages having single, dual and quad terminal positions.

This testing phase of ICs is a significant expense and a time consuming procedure that factors into the overall cost of producing the IC's.

Accordingly, reducing the test time required to check shorts between all adjacent pins, and also check the continuity of all pins for packages including those with single, dual and quad terminal positions is desired.

SUMMARY OF THE INVENTION

The present invention achieves technical advantages as an integrated circuit process whereby shorts between all adjacent pins are checked while simultaneously determining continuity of all pins to reduce the overall process to three steps.

In one preferred embodiment, the process includes categorizing all pins of an IC package into three sets of pins. During a first step, the first set of pins are each connected to a digital instrument, a second set of pins is connected to 0 volts, and a third set of pins is left open. The digital instruments then sink current in parallel from the first set of pins, while the second set of pins are grounded. This step checks shorts between adjacent pins of the first set of pins, whereby a short is detected if the digital instruments read a voltage of 0 volts.

In the second step, the digital instruments then sink current in parallel from the second set of pins, while the third set of pins are grounded. This second step checks shorts between the pins adjacent the second set of pins.

In the third step, the digital instruments sink current in parallel from the third set of pins, while the first set of pins are grounded to 0 volts. This step checks shorts between pins adjacent the third set of pins.

For packages having double and quad terminal position packages, each side of the package is treated like a single terminal position package, and the measurements of the pins of each terminal position are measured in parallel.

Advantageously, multisided IC packages can also be completely tested in only three steps to identify any pin shorts and verify pin continuity.

DETAILED DESCRIPTION OF THE PREFERRED EMBODIMENT

Figure 1:
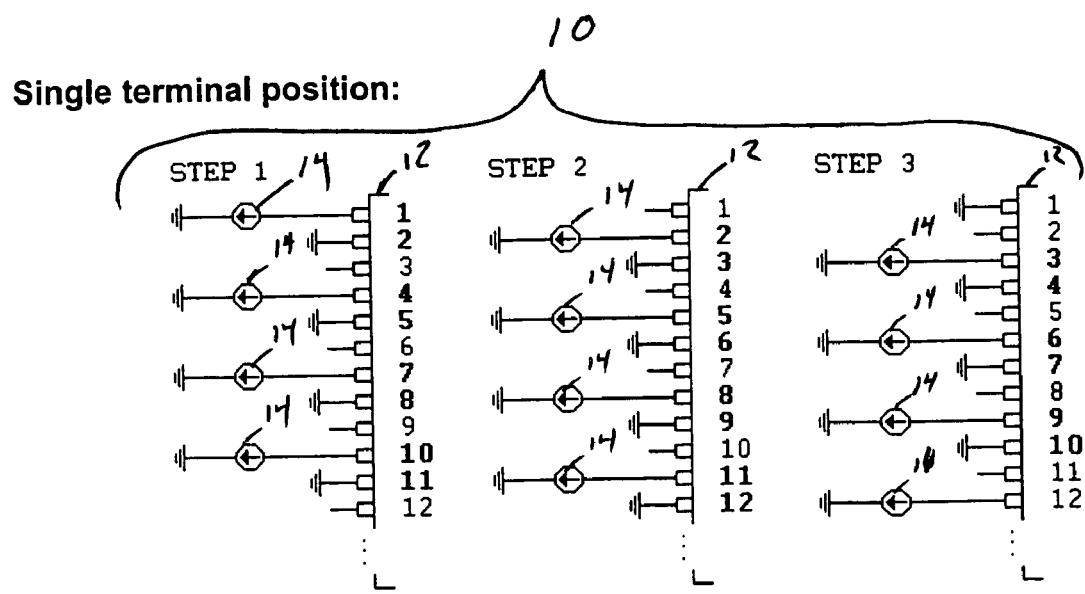
FIG. 1 illustrates the three step testing method of the present invention for a single terminal position to simultaneously identify pin shorts and verify pin continuity.

Referring now to FIG. 1, there is shown at 10 a three step IC testing methodology according to the present invention identifying pin shorts and verifying continuity for all pins of a single terminal position IC package shown at 12. In this example, all the pins of the single terminal position package 12 are seen to be categorized into three sets of pins, with the first set of pins comprising of pins 1, 4, 7, 10, . . . , the second set of pins comprising of pins 2, 5, 8, 11, . . . , and the third set of pins comprising pins 3, 6, 9, 12 . . . .

In step one, a separate digital instrument is connected to each of the first set of pins, with each of the second set of pins being grounded. In step one, each of the third set of pins is left open, and thus is not connected. Each digital instrument 14 then sinks current, in parallel, from the respective pin of the first set of pins, and preferably, 1 mA is sunk from each pin. By sinking the current from each of the first set of pins, in parallel, any shorts between adjacent pins 1–2, 4–5, 7–8, 10–11, . . . are ascertained. If the parallel configured digital instruments measure 0 volts, then at least one of the first set of pins have an adjacent pin short. If, however, the voltage measured by the parallel configured digital instruments is different than 0 volts, then there is not an adjacent pin short for any of the pins in the first set of pins.

Next, in step 2, shorts are checked for adjacent pins 2–3, 5–6, 8–9, 11–12, and so forth. The digital instruments sink current, in parallel, from the second set of pins, and the third set of pins are grounded, the first set of pins being left open.

In step 3, shorts are checked between adjacent pins 3–4, 6–7, 9–10, 12–13 and so forth. The digital instruments sink current, in parallel, from the third set of pins, the first set of pins are grounded, and the second set of pins are left open.

By performing only these three steps, all pins of a terminal position are checked for both shorts and continuity. This is advantageously done according to the methodology by categorizing all pins of a terminal position in three sets of pins, and sinking current in each step whereby each of the digital instruments are configured in parallel.

It is necessary that the integrated circuit ground pin is always tied to the digital instrument ground. Thus, in any of the three steps when a digital instrument 14 was to be connected to this integrated circuit ground pin, and an adjacent pin was to be connected to 0 volts, the digital instrument and ground is swapped so that the ground pin of the integrated circuit 12 is always tied to ground, and the next pin is connected to 0 volts.

Figure 2:
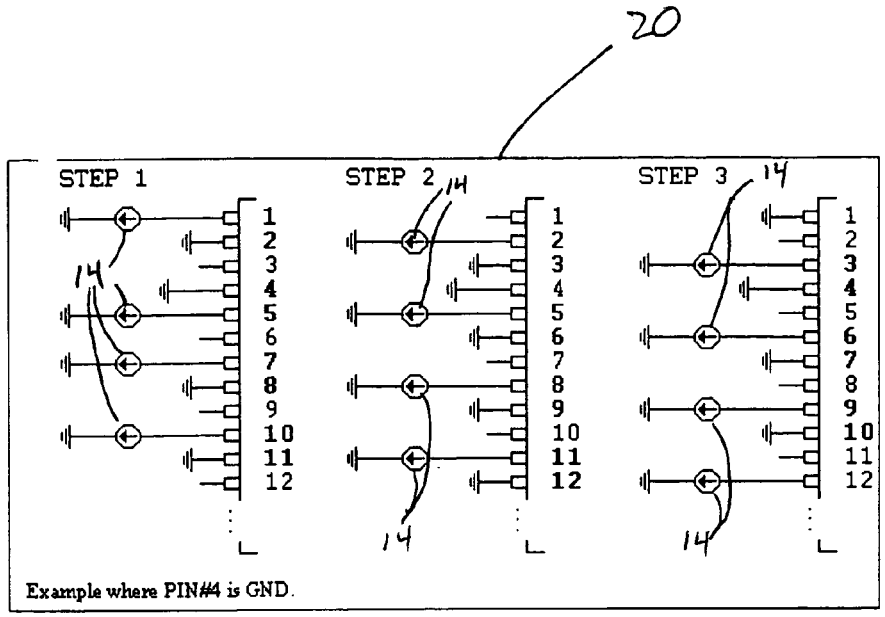
FIG. 2 illustrates the three step process for the single terminal position whereby pin 4 is the IC ground.
Figure 3:
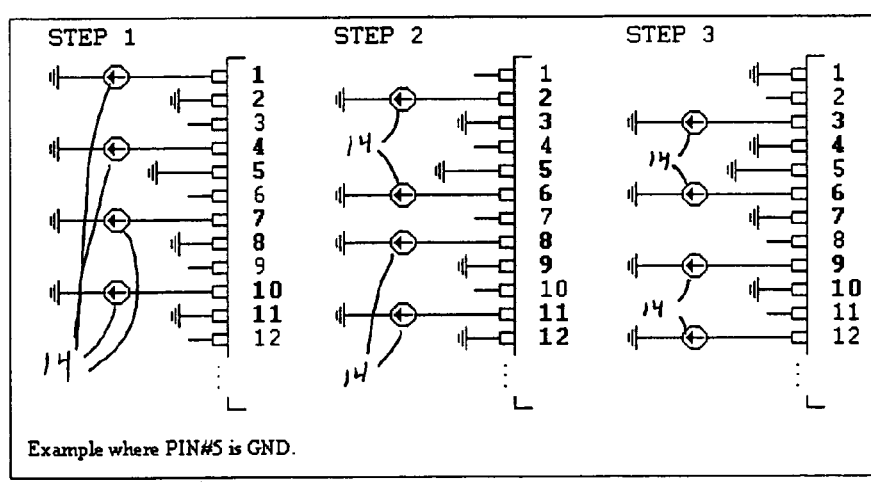
FIG. 3 illustrates the three step process for the single terminal position whereby pin 5 is the IC ground.
Figure 4:
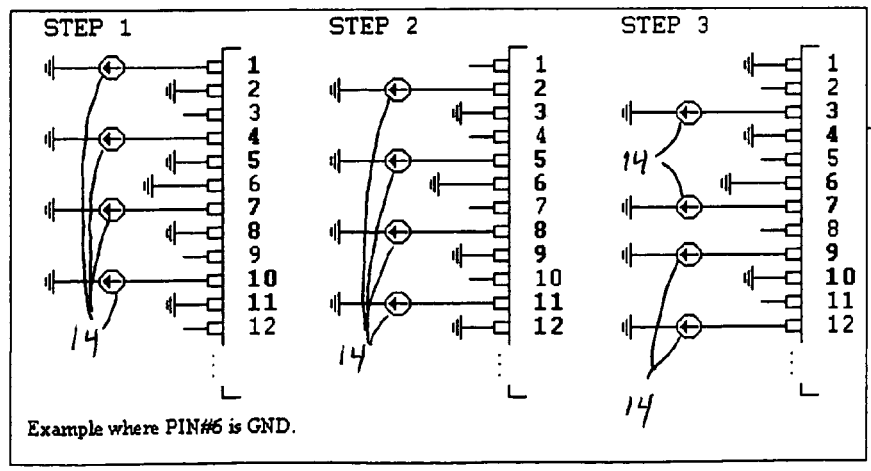
FIG. 4 illustrates the three step process for the single terminal position whereby pin 6 is the ground.

Turning now to FIGS. 2–4, there is illustrated at 20, 30, and 40, respectively, how the procedure is performed when the integrated circuit pin 4 is ground, pin 5 is ground, and pin 6 is ground, respectively. For instance, as shown in FIG. 2, in step 1 pin 4 is grounded and pin 5 has the digital instrument 14 sinking current therefrom. In step 2, pin 4 remains grounded, a digital instrument 14 continues to sink current from pin 5, and pin 6 is grounded. In step 3, pin 4 remains grounded, and step 3 is that methodology shown in FIG. 1.

Referring to FIG. 3, when pin 5 is the integrated circuit ground, step 1 is that of FIG. 1. In step 2, however, the digital instrument 14 sinks current from pin 6, and pin 5 remains grounded. In step 3, pin 5 remains grounded.

Referring to FIG. 4, when the integrated circuit 12 has pin 6 designated as ground, pin 6 remains grounded in all three steps, however, in the step 3 the digital instrument 14 is connected to pin 7 and sinks current therefrom.

Figure 5:
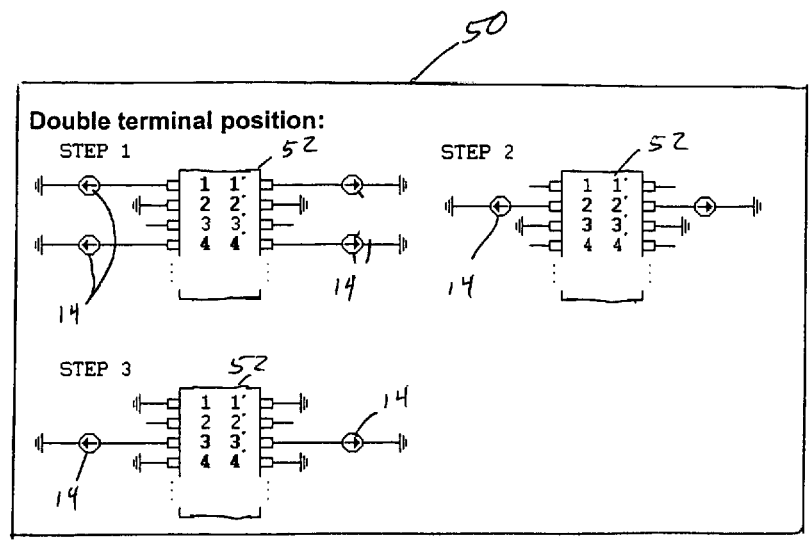
FIG. 5 illustrates the three step process for a double terminal position package.

Referring now to FIG. 5, there is shown a method for testing at 50 a double terminal position package 52. Every terminal position of the package 50 is treated as a single terminal, and the measurements of the pins of each terminal position are done in parallel, as shown. For the continuity test, however, it is noted that only the integrated circuit ground pin needs to be ground.

Figure 6:
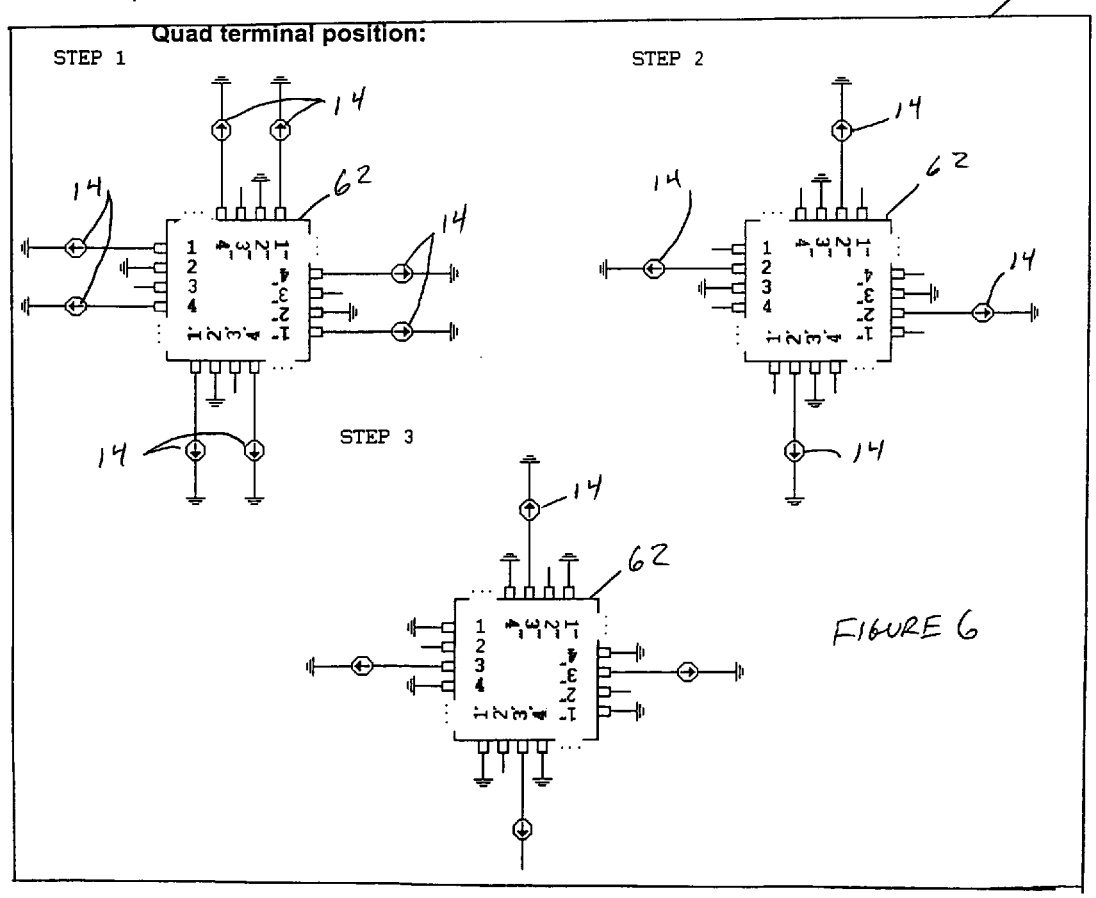
FIG. 6 illustrates the three step process for testing a quad terminal position package.

Referring to FIG. 6, there is shown at 60 the process of the present invention applied to a quad terminal position package 62. For this package 62, again, each terminal position of the package is treated as a single terminal position, and each terminal position is measured simultaneously, in parallel, with the other terminal positions such that only three steps are required to test both for shorting of adjacent pins, and continuity of all the pins in these three steps.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A method for testing functionality of an integrated circuit having at least one terminal block having a plurality of pins, comprising the steps of:
    categorizing the plurality of pins into a first set, a second set, and a third set of pins;
    sinking current in parallel from the first set of pins, grounding the second set of pins, and having the third set of pins open;
    sinking current in parallel from the second set of pins, grounding the third set of pins, and having the first set of pins open; and
    sinking current in parallel from the third set of pins, grounding the first set of pins, and having the second set of pins open, such that all the plurality of pins are tested for continuity and shorts with adjacent said pins.

2. The method as specified in claim 1 wherein the current is sunk from the respective pins using a plurality of digital instruments.

3. The method as specified in claim 2 further comprising the step of the parallel digital instruments measuring the respective pin voltage such that a reading of 0 volts indicates one of the pins has a short.

4. The method as specified in claim 3 wherein the measured pin voltage being other than 0 volts indicates there is no short of the respective pins.

5. The method as specified in claim 3 wherein one of the plurality of pins designated as an IC ground pin is always tied to ground, and the digital instrument never sinks current from the IC ground pin.

6. The method as specified in claim 1 wherein the integrated circuit has a plurality of the terminal blocks, whereby the method of claim 1 is performed on each of the terminal blocks simultaneously.

7. The method as specified in claim 6 wherein current is sunk in parallel from the respective sets of pins for all the terminal blocks.

8. The method as specified in claim 7 wherein the integrated circuit comprises two terminal blocks.

9. The method as specified in claim 7 wherein the integrated circuit comprises four terminal blocks.

10. The method as specified in claim 1 wherein the first set of pins comprise pins 1, 4, 7, 10 . . . , the second set of pins comprise pins 2, 5, 8 11 . . . , and the third set of pins comprise pins 3, 6, 9, 12 . . . .

\* \* \* \* \*